United States Patent
Sarin et al.

(10) Patent No.: US 9,177,651 B2
(45) Date of Patent: *Nov. 3, 2015

(54) PROGRAMMING METHODS AND MEMORIES

(71) Applicant: Micron Technology, Inc., Boise, ID (US)

(72) Inventors: Vishal Sarin, Saratoga, CA (US); William H. Radke, Los Gatos, CA (US); Frankie F. Roohparvar, Monte Sereno, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/108,822

(22) Filed: Dec. 17, 2013

(65) Prior Publication Data

US 2014/0104958 A1    Apr. 17, 2014

Related U.S. Application Data

(63) Continuation of application No. 13/176,886, filed on Jul. 6, 2011, now Pat. No. 8,687,431.

(51) Int. Cl.
| | | |
|---|---|---|
| *G11C 11/00* | (2006.01) | |
| *G11C 16/10* | (2006.01) | |
| *G11C 16/04* | (2006.01) | |
| *G11C 16/34* | (2006.01) | |

(52) U.S. Cl.
CPC ............ *G11C 16/10* (2013.01); *G11C 16/0483* (2013.01); *G11C 16/3418* (2013.01); *G11C 16/3454* (2013.01); *G11C 16/3427* (2013.01)

(58) Field of Classification Search
CPC ........................................................ G11C 10/00
USPC ..................................................... 365/185.01
See application file for complete search history.

(56) References Cited

U.S. PATENT DOCUMENTS

| 7,630,248 | B2 | 12/2009 | Li | |
|---|---|---|---|---|
| 8,335,107 | B2 * | 12/2012 | Lee | 365/185.11 |
| 2008/0019185 | A1 * | 1/2008 | Li | 365/185.22 |
| 2008/0019186 | A1 * | 1/2008 | Li | 365/185.22 |
| 2008/0056007 | A1 | 3/2008 | Kang et al. | |
| 2009/0034337 | A1 | 2/2009 | Aritome | |
| 2009/0106482 | A1 | 4/2009 | Sarin et al. | |
| 2009/0168538 | A1 | 7/2009 | Lee | |
| 2009/0303788 | A1 * | 12/2009 | Roohparvar et al. | 365/185.02 |
| 2010/0027348 | A1 | 2/2010 | Kim | |
| 2010/0103731 | A1 | 4/2010 | Yoo et al. | |
| 2010/0103734 | A1 | 4/2010 | Hemink | |
| 2010/0149868 | A1 | 6/2010 | Yoo et al. | |
| 2013/0010542 | A1 * | 1/2013 | Sarin et al. | 365/185.24 |

FOREIGN PATENT DOCUMENTS

KR    10-2010-0106761    10/2010

* cited by examiner

*Primary Examiner* — Min Huang
(74) *Attorney, Agent, or Firm* — Dicke, Billig & Czaja, PLLC

(57) ABSTRACT

Methods of programming a memory and memories are disclosed. In at least one embodiment, a memory is programmed by determining a pretarget threshold voltage for a selected cell, wherein the pretarget threshold voltage is determined using pretarget threshold voltage values for at least one neighbor cell of the selected cell.

19 Claims, 8 Drawing Sheets

PROGRAMMING METHODS AND MEMORIES

RELATED APPLICATION

This application is a continuation of U.S. patent application Ser. No. 13/176,886, filed Jul. 6, 2011, titled "PROGRAMMING METHODS AND MEMORIES," and issued as U.S. Pat. No. 8,687,431 on Apr. 1, 2014, which is commonly assigned and incorporated herein by reference.

FIELD

The present disclosure relates generally to memories, and in particular, in one or more embodiments, the present disclosure relates to programming flash memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space of 0.2V to 0.4V is between each range to keep the ranges from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state can be very important. The width is related to many variables in the operation of a memory circuit. For example, a cell could be verified at one temperature and read at a different temperature. The circuitry that determines if the cell is erased or programmed to the correct Vt range has to make that determination. That circuitry has some of its characteristics influenced by temperature. A Vt window is a sum of all of these types of differences, translating into a shift in the perceived window of the Vt. In order for the window to operate, the width of the four states plus a margin between each state should amount to the available window.

When a cell in a memory is programmed, the programming of the cell can affect the threshold voltage of neighbor cells to that cell. Specifically, program coupling, such as floating gate to floating gate coupling or other charge storage structure to charge storage structure coupling, can affect the threshold voltage of a horizontally neighboring cell, a vertically neighboring cell, or a diagonally neighboring cell. When a cell is programmed to a target threshold voltage, and a neighbor cell is subsequently programmed, the movement in threshold voltage of the neighbor cell may have a coupling effect on the already programmed cell. The effect is a function of an amount of movement of the threshold voltage of the neighbor cell, and of a coupling ratio between the neighbor cell and the already programmed cell. As the number of bits per cell in memory cells increases, the number of threshold voltage distribution windows increases, and the tolerance for error in those windows decreases, and floating gate to floating gate coupling can become a large portion of program disturb.

For reasons such as those stated above, and for other reasons, such as those stated below, which will become apparent to those skilled in the art upon reading and understanding the present specification, there is a need in the art for, among other things, reducing floating gate to floating gate coupling in memory programming.

DETAILED DESCRIPTION

Figure 1:
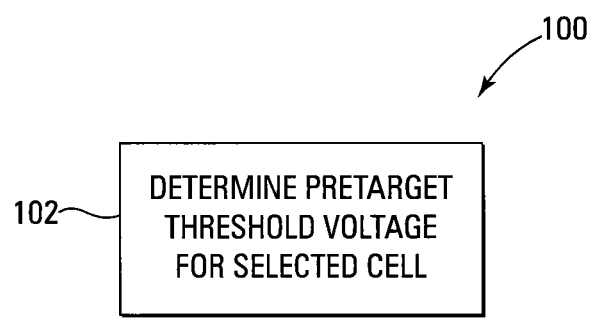
FIG. 1 is a flow chart diagram of a method according to an embodiment of the present disclosure.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

The various embodiments disclosed herein include precompensation for programming a selected cell to a threshold voltage below a target threshold voltage, the precompensation taking into account coupling disturb for the programming of neighbor cells to the selected cell. More specifically, the various embodiments may reduce a gap between a precompensated target threshold voltage and a target threshold voltage.

Floating gate to floating gate coupling has been compensated using a reduction of a target threshold voltage of a selected cell to account for later program disturb when programming neighbor cells to the selected cell. However, as an amount of coupling disturb is not known before programming, typical adjustments simply adjust a pretarget voltage to a set amount below a target threshold voltage for an entire page of a memory. In this type of adjustment, not only do some cells have pretarget voltages that are much too low, leading to increased error in programming, but some may have pretarget threshold voltages set too high, which can result in overprogramming, that is, programming into a next voltage range. Each of these errors is a problem in its own right, and each are corrected by the various embodiments described herein.

A method 100 of programming a memory is shown in flow chart form in FIG. 1. Method 100 comprises determining a pretarget threshold voltage for a selected cell in block 102. Determining a pretarget threshold voltage uses coupling ratios between a selected cell and each of its neighbor cells in one embodiment. The "neighbor cells" of a selected cell can include those cells immediately adjacent the cell in the memory. For example, there can be cells horizontally adjacent to the selected cell (e.g., that are on the same word line), there can be cells vertically adjacent to the selected cell (e.g., that are on the same bit line), and there can be cells diagonally adjacent to the selected cell (e.g., that are on a bit line and word line one different than the selected cell's bit line and word line).

Figure 2:
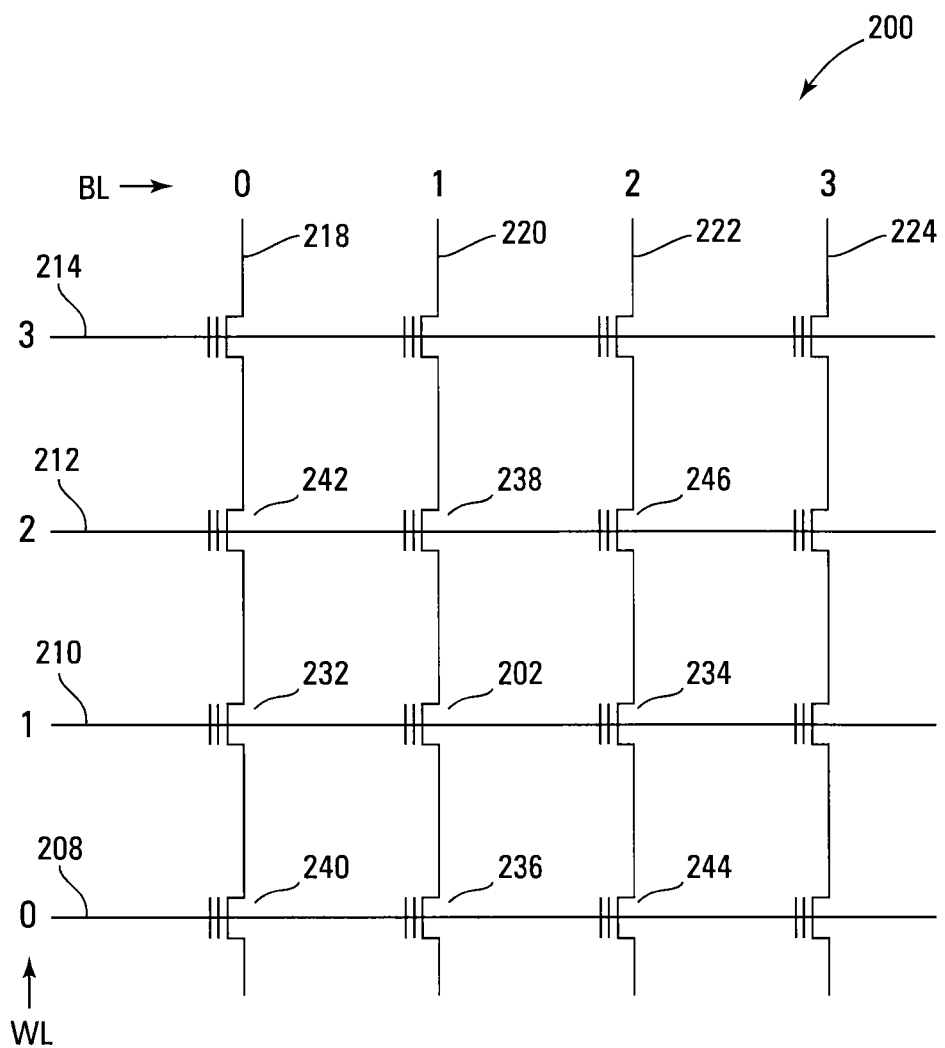
FIG. 2 is a diagram of a portion of an array according to an embodiment of the present disclosure.

Determining in another embodiment further comprises setting the pretarget threshold voltage for the selected cell to an amount equal to a target threshold voltage for the selected cell minus an amount proportional to a summed threshold voltage shift due to all neighbor cells to the selected cell. A partial diagram of an array 200 of a memory device is shown in FIG. 2. A selected cell 202 that is to be programmed is accessed using a word line 210 and a bit line 220. Cell 202 has eight neighbor cells that will also be programmed during a programming of the array 200. Horizontally adjacent neighbor cells are cells 232 and 234 on word line 210. Vertically adjacent neighbor cells are cells 236 and 238 on bit line 220. Diagonally adjacent neighbor cells are cells 240 and 242 on adjacent bit line 218 and adjacent word lines 208 and 212, and cells 244 and 246 on adjacent bit line 222 and adjacent word lines 208 and 212. As is known, when neighbor cells 232, 234, 236, 238, 240, 242, 244, and 246 are programmed, the programming will affect the threshold voltage of cell 202, such as due to floating gate to floating gate coupling. Each type of neighbor cell to selected cell 202, for example horizontal neighbor cells, vertical neighbor cells, and diagonal neighbor cells, will have a coupling ratio that can be determined (e.g., measured or predetermined). This coupling ratio is determined in one embodiment to be a percentage of the amount of movement in threshold voltage for the neighbor cell that couples to the selected cell 202. For example, if a movement in threshold voltage for a horizontal neighbor cell is 500 milliVolts and the change in threshold voltage for the selected cell is 50 mV, the coupling ratio is 10%. It should be understood that while linear coupling has been described, other coupling may also be compensated using the methods described herein. If a coupling amount can be determined, it can be compensated. Techniques for determining other coupling, such as, for example, non-linear coupling, are known and are not discussed further herein.

In one embodiment, a determination is made of how much movement due to floating gate to floating gate coupling a selected cell 202 will have due to subsequent programming of its neighbor cells. The determination is made by determining (e.g., calculating) a threshold voltage movement for each neighbor cell multiplied by its respective coupling ratio. The sum of each threshold voltage movement for each neighbor cell is a total (e.g., summed or proportional to summed) threshold voltage shift due to floating gate to floating gate coupling for programming of the neighbor cells to a selected cell 202. This determination is used in one embodiment to precompensate a pretarget threshold voltage value for the selected cell 202. That is, knowing the amount of threshold voltage shift that will be coupled to a selected cell 202 allows the pretarget programming threshold voltage of the selected cell 202 to be determined with greater specificity than in previous memories.

In another level of specificity in determining movement of a threshold voltage of a selected cell 202, the determination of what threshold voltage the neighbor cells to the selected cell are to be programmed to is made on the basis of the pretarget threshold voltages to which the neighbor cells to the neighbor cells are to be programmed to, and further takes into account the charge storage structure to charge storage structure coupling for neighbor cells to their neighbor cells. Specifically, in one embodiment, the determination of an amount of coupling that a selected cell 202 will be subjected to is determined using a pretarget threshold voltage for each of its neighbor cells, which is in turn determined using a pretarget threshold voltage for the neighbor cells to the neighbor cells.

Figure 3A:
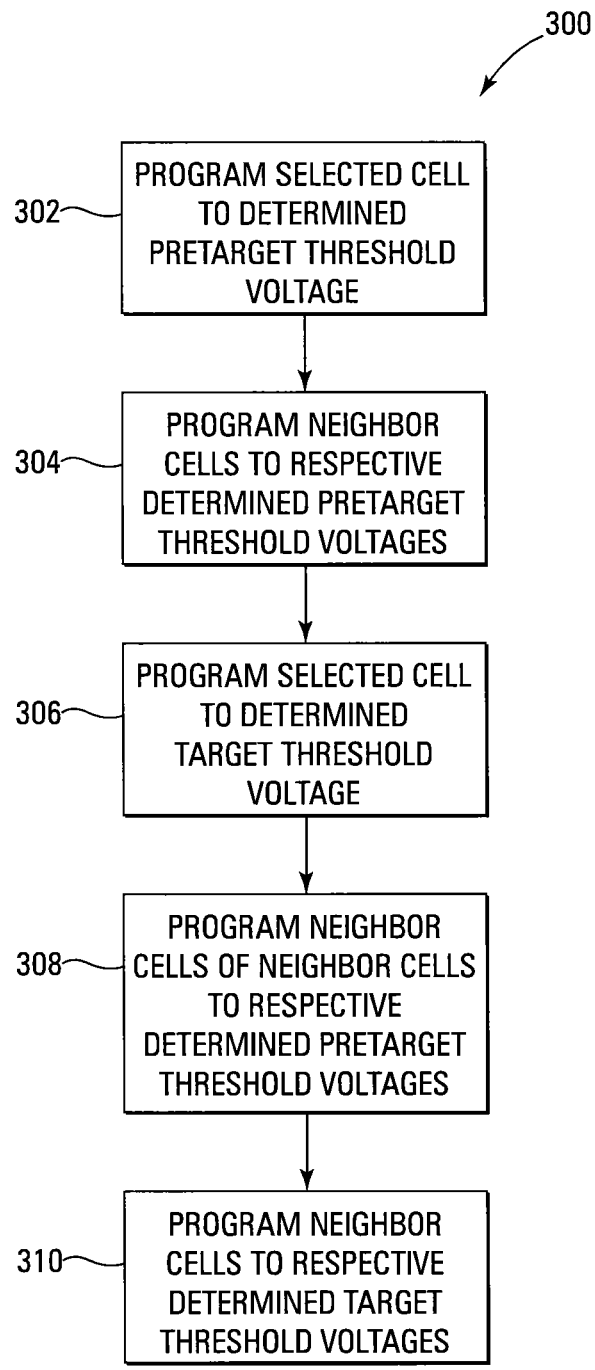
FIG. 3A is a flow chart diagram of a method according to another embodiment of the present disclosure.

A method 300 for programming a memory is shown in flow chart form in FIG. 3A. Method 300 comprises programming a selected cell to a determined pretarget threshold voltage in block 302, programming neighbor cells to the selected cell to respective determined pretarget threshold voltages in block 304, programming the selected cell to a determined target threshold voltage in block 306, programming neighbor cells of neighbor cells to respective determined pretarget threshold voltages in block 308, and programming the neighbor cells to a determined target threshold voltage in block 310. Programming neighbor cells to neighbor cells is repeated in one embodiment until all cells of a page are programmed to their target threshold voltages.

Figure 3B:
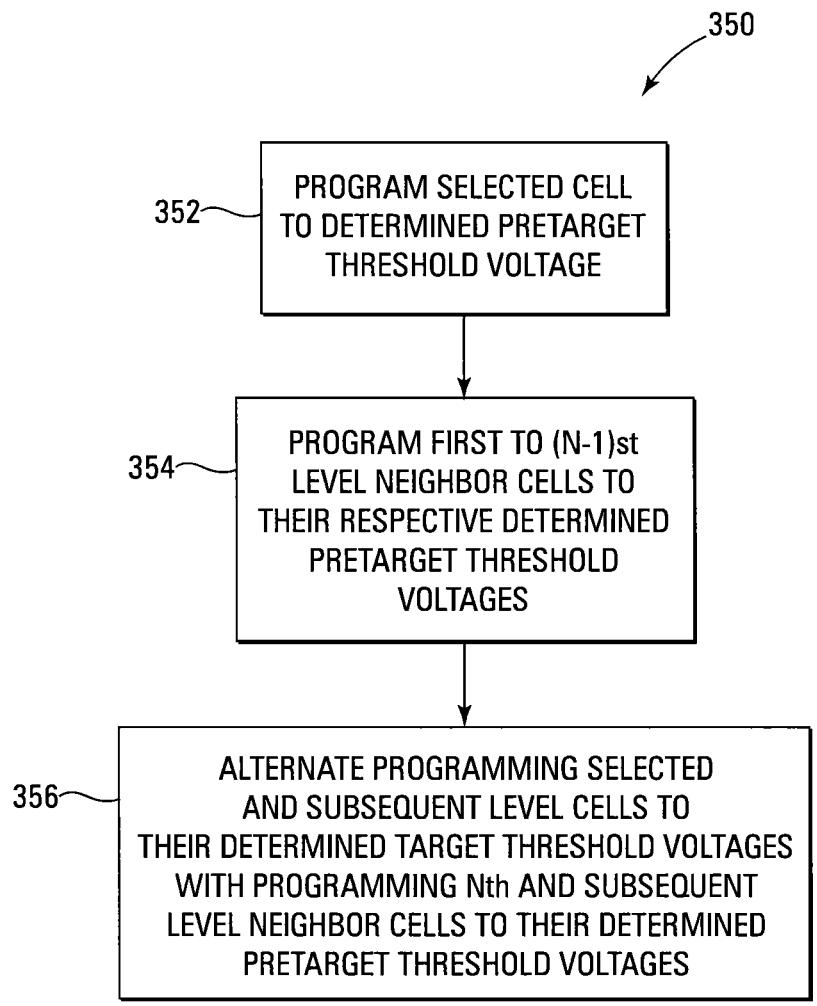
FIG. 3B is a flow chart diagram of a method according to another embodiment of the present disclosure.

The method 300 may be expanded to additional programming methods as is shown in flow chart form 350 in FIG. 3B. Specifically, method 350 of programming a memory comprises programming a selected cell to a determined pretarget threshold voltage in block 352, programming first to (N−1)st level neighbor cells of the selected cell to respective determined pretarget threshold voltages in block 354, and alternating programming selected and subsequent level neighbor cells to their determined target threshold voltages with programming Nth and subsequent level neighbor cells to their pretarget threshold voltages in block 356. That is, the method alternates programming to a target threshold voltage and a pretarget threshold voltage for cells in a pattern of second level neighbor cells to target threshold voltages, Nth level neighbor cells to pretarget threshold voltages, third level neighbor cells to target threshold voltages, (N+1)st level neighbor cells to their pretarget threshold voltages, and so on, until programming is complete. The method may be referred to as a rolling N pretarget precompensation.

FIG. 3A shows a rolling 2 pretarget precompensation. This method is expanded to rolling N in FIG. 3B. Neighbor level cells are defined as follows for this embodiment. A first level neighbor cell to a selected cell is a cell that is either one word line away, one bit line away, or one word line and one bit line away from the selected cell. A second level neighbor cell is a neighbor cell to a neighbor cell of a selected cell, and so on, until programming is complete.

Applying the method 350 to a rolling 3 pretarget precompensation, the following occurs. A selected cell is programmed to its determined pretarget threshold voltage. The first and second level neighbor cells to the selected cell are programmed to their determined pretarget threshold voltage. Then, the selected cell is programmed to its target threshold voltage. Then, the third level neighbor cells are programmed to their determined threshold voltages, the first level neighbor cells are programmed to their target threshold voltages, and so on until programming is complete.

Figure 4:
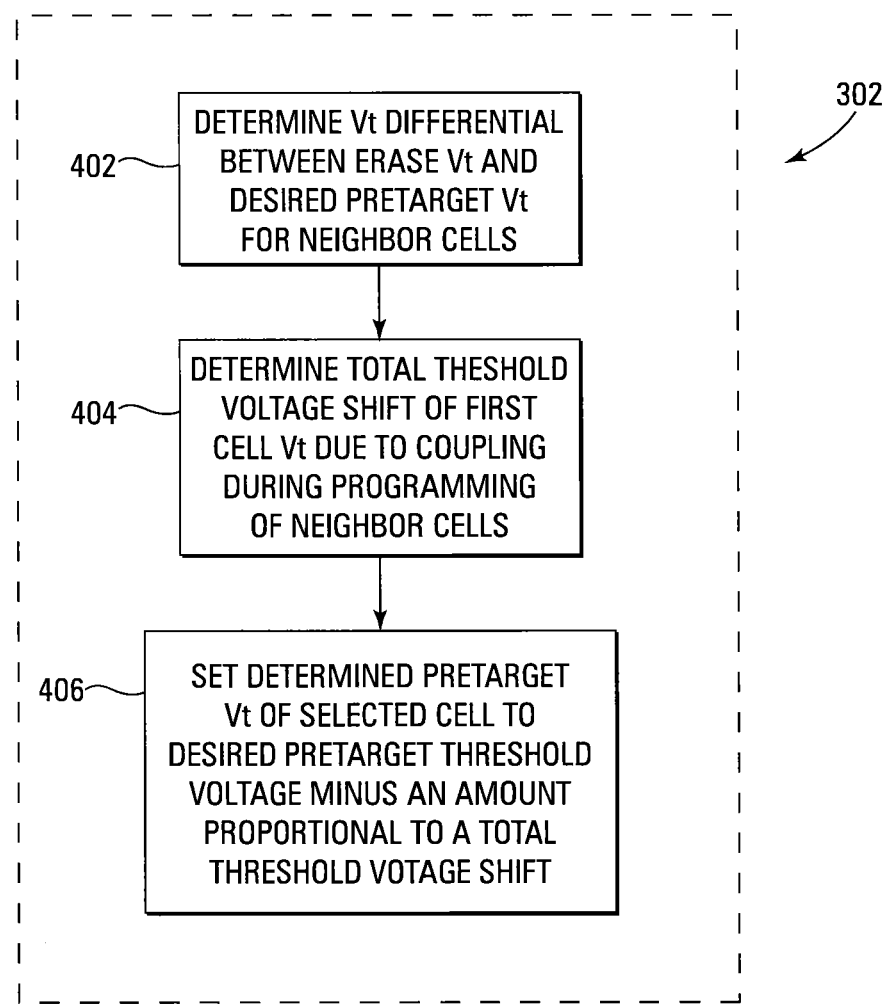
FIG. 4 is a flow chart diagram of a method according to another embodiment of the present disclosure.

In one embodiment, programming the selected cell to a determined pretarget threshold voltage as in block 302 is shown in FIG. 4, and comprises determining a threshold voltage differential between a memory erase threshold voltage and a desired pretarget threshold voltage for neighbor cells to the selected cell in block 402, determining (e.g., computing) a total threshold voltage shift of the selected cell threshold voltage due to coupling during later programming of the neighbor cells in block 404, and setting the determined pretarget threshold voltage of the selected cell to the determined target threshold voltage minus an amount proportional to a summed threshold voltage shift in block 406. In one embodiment, the memory erase threshold voltage is an average erase threshold voltage for the page or block of the array.

In NAND memories, a block of memory is erased all at once, in known fashion. The threshold voltage of an erased cell is typically a negative threshold voltage. However, not every cell in a block will erase to an identical erase voltage. Some cells will have more negative threshold voltages than an average erase threshold voltage, and other cells will have less negative threshold voltages than the average erase threshold voltage. In another embodiment, the actual voltage of each erased cell is determined (e.g., measured) in a sense operation, and the threshold voltage differential between the cell's erased threshold voltage and its target (or pretarget) threshold voltage is determined. In this embodiment, the determination (e.g., calculation) of the amount of movement in threshold voltage for the cell when the cell is a neighbor cell allows for an even tighter control on the pretarget threshold voltage since the actual amount of movement of the neighbor cell's threshold voltage is known.

Figure 5:
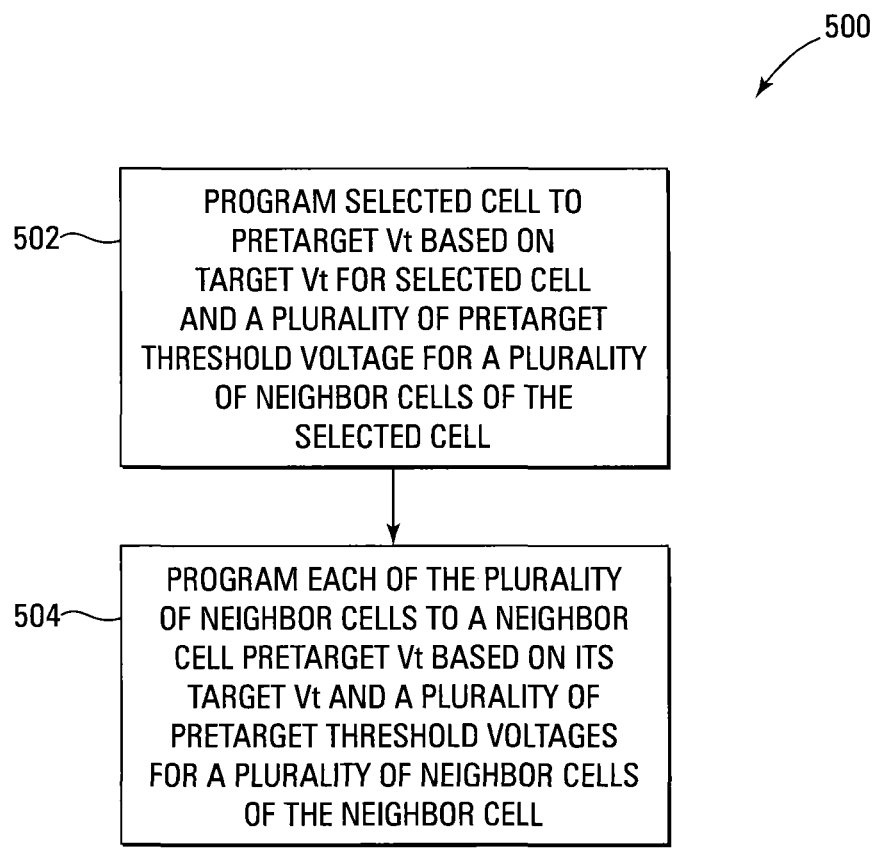
FIG. 5 is a flow chart diagram of a method according to another embodiment of the present disclosure.

In another embodiment shown in FIG. 5, a method 500 for programming a memory is shown. Method 500 comprises programming a selected cell to a pretarget threshold voltage based on a target threshold voltage for the selected cell and a plurality of pretarget threshold voltages for a plurality of neighboring cells of the selected cell in block 502, and programming each of the plurality of neighbor cells to a neighbor cell pretarget threshold voltage based on a target threshold voltage for its neighbor cell target threshold voltage and a plurality of pretarget threshold voltages for a plurality of neighbor cells of the neighbor cell in block 504. A threshold voltage shift (e.g., a total coupling voltage) due to the plurality of neighboring cells to one or more levels of neighbor cells can be determined (e.g., computed), and the pretarget threshold voltage determined (e.g., assigned) as a target threshold voltage minus the total threshold voltage shift, or an amount proportional thereto. As has been described, this total threshold voltage shift depends on the coupling due to the neighbor cells, and can also be determined using sensed actual erase voltages of the neighbor cells to more accurately precompensate the pretarget voltage of a cell to be programmed. Further, it should be understood that before programming neighbor cells to a pretarget threshold voltage, in some embodiments, the pretarget threshold voltages for neighbor cells to the neighbor cells are also determined, and that this process can be carried out until all cells of a page of the memory are programmed.

In such embodiments, a programming operation is performed as follows. A selected cell is programmed to a precompensated pretarget threshold voltage. This precompensated pretarget threshold voltage is determined (e.g., calculated) using an expected amount of threshold voltage movement due to coupling between the unprogrammed neighbor cells and the selected cell. Once the selected cell is programmed to the precompensated pretarget threshold voltage, the neighbor cells to the selected cell are programmed to their determined pretarget threshold voltage values. Their pretarget threshold voltages are each determined using an expected amount of threshold voltage movement due to coupling between second level neighbor cell and the neighbor cells to that second level neighbor cell. Then, the selected cell is programmed to its target threshold voltage. Then the second level neighbor cells are programmed to their determined pretarget threshold voltage values, using the same determination process as is used for the neighbor cells. Then, the neighbor cells to the selected cell are programmed to their respective target threshold voltages, and so on until the page is fully programmed.

Figure 6:
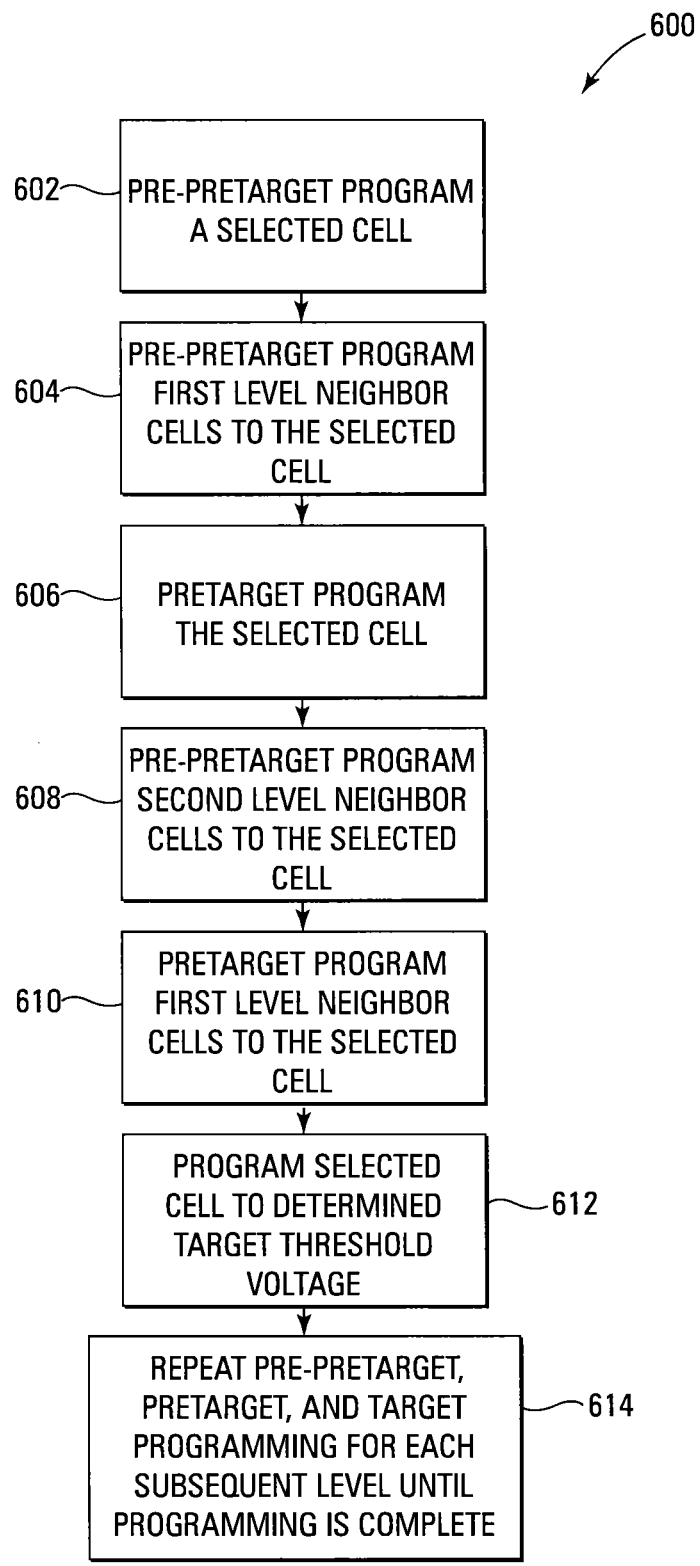
FIG. 6, is a flow chart diagram of a method according to another embodiment of the present disclosure.

The methods described above have each level of cell programmed in two steps. In other embodiments amenable to use with the methods described above, additional program steps can be used for each level of cells. That is, three program steps may be used, in what may be referred to as three pass programming. In three pass programming, each level of cells is programmed in three steps. In one embodiment of three pass programming, a programming method operates as is shown in greater detail in FIG. 6. In a three pass programming, there are two pretarget programming steps instead of the one described in the methods above. Specifically, a three pass programming comprises pre-pretarget programming of a selected cell in block 602, pre-pretarget programming of first level neighbor cells to the selected cell in block 604, pretarget programming of the selected cell in block 606, pre-pretarget programming of second level neighbor cells in block 608, pretarget programming of first level neighbor cells in block 610, programming to determined target threshold voltage of the selected cell in block 612, and repeating pre-pretarget, pretarget, and target programming for each next subsequent level in block 614, until programming is complete. Block 614 for the next iteration would be pre-pretarget program third level neighbor cells, pretarget program second level neighbor cells, and target program first level neighbor cells. Pre-pretarget programming levels are determined in the same way as pretarget programming levels are determined in one embodiment.

In operation, the various methods allow for pretarget threshold voltages to be closer to target threshold voltages. This in turn results in smaller total error in programming. Total error is a function of the voltage gap between pretarget and target threshold voltages and a coupling ratio. Therefore, when the gap between a pretarget threshold voltage and a target threshold voltage is reduced, the overall error for programming that memory is also reduced. Data is programmed to pretarget levels in one or more sequence, and to final levels in a final sequence. The pretarget levels are compensated in one embodiment for disturb so as to tighten pretarget distributions enabling a tight final distribution.

The methods described herein are capable of being performed in a pipelined fashion. That is, as a particular page is being programmed, the next page can be buffered, and the precompensation described herein for a page is performed during programming of a previous page, so programming can occur at the same speed as in previous memories, but with a reduced total error in programming.

Figure 7:
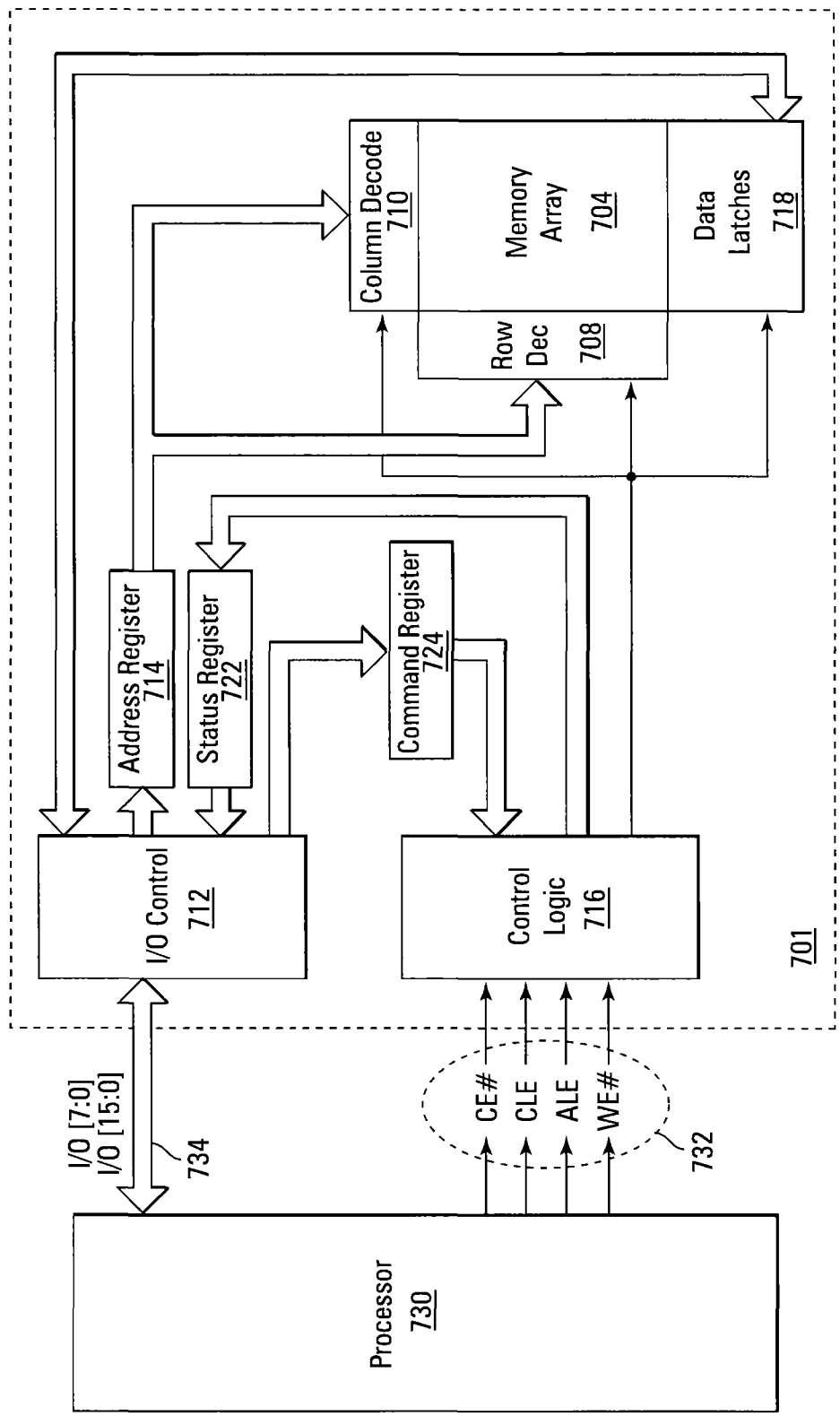
FIG. 7 is a functional block diagram of an electrical system having at least one memory device with a memory array configuration according to one embodiment of the present disclosure.

FIG. 7 is a simplified block diagram of a memory device 701 according to an embodiment of the disclosure, and on which various embodiments of the disclosure are practiced. Memory device 701 includes an array of memory cells 704 arranged in rows and columns. The memory device also includes a controller, which can be realized in hardware, firmware, and/or software, for example. One example of a controller can include I/O control circuitry 712 and/or control logic 716. Although the various embodiments will be described primarily with reference to NAND memory arrays, the various embodiments are not limited to a specific architecture of the memory array 704. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 708 and a column decode circuitry 710 are provided to decode address signals provided to the memory device 701. Address signals are received and decoded to access memory array 704. Memory device 701 also includes input/output (I/O) control circuitry 712 to manage input of commands, addresses and data to the memory device 701 as well as output of data and status information from the memory device 701. An address register 714 is coupled between I/O control circuitry 712 and row decode circuitry 708 and column decode circuitry 710 to latch the address signals prior to decoding. A command register 724 is coupled between I/O control circuitry 712 and control logic 716 to latch incoming commands. Control logic 716 controls access to the memory array 704 in response to the commands and generates status information for the external processor 730. The control logic 716 is coupled to row decode circuitry 708 and column decode circuitry 710 to control the row decode circuitry 708 and column decode circuitry 710 in response to the addresses.

Control logic 716 is also coupled to a sample and hold circuitry 718. The sample and hold circuitry 718 latches data, either incoming or outgoing, in the form of analog voltage signals. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 718 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 712 for output from the memory device, in the case of a read operation, or used for comparison during one or more verify operations in programming the memory device. It is noted that the I/O control circuitry 712 could optionally include analog-to-digital conversion functionality and digital-to-analog conversion (DAC) functionality to convert read data from an analog signal to a digital bit pattern and to convert write data from a digital bit pattern to an analog signal such that the memory device 701 could be adapted for communication with either an analog or digital data interface.

During a write operation, selected memory cells of the memory array 704 are programmed, in one embodiment according to the embodiments for precompensating pretarget threshold voltages for cells and neighbor cells, until voltages indicative of their Vt levels match the levels held in the sample and hold circuitry 718. This can be accomplished, as one example, using differential sensing devices to compare the held voltage level to a threshold voltage of the selected memory cell. Much like traditional memory programming, programming pulses could be applied to a selected memory cell to increase its threshold voltage until reaching or exceeding the desired value. In a read operation, the Vt levels of the selected memory cells are passed to the sample and hold circuitry 718 for transfer to an external processor (not shown in FIG. 7) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the selected memory cell becomes activated. Alternatively, a boosted voltage could be applied to a first source/drain side of a selected memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 718 may include caching, i.e., multiple storage locations for each data value, such that the memory device 701 may be reading a next data value while passing a first data value to the external processor, or receiving a next data value while writing a first data value to the memory array 704. A status register 722 is coupled between I/O control circuitry 712 and control logic 716 to latch the status information for output to the external processor.

Memory device 701 receives control signals at control logic 716 over a control link 732. The control signals may include a chip enable CE #, a command latch enable CLE, an address latch enable ALE, and a write enable WE #. Memory device 701 may receive commands (in the form of command signals), addresses (in the form of address signals), and data (in the form of data signals) from an external processor over a multiplexed input/output (I/O) bus 734 and output data to the external processor over I/O bus 734.

In a specific example, commands are received over input/output (I/O) pins [7:0] of I/O bus 734 at I/O control circuitry 712 and are written into command register 724. The addresses are received over input/output (I/O) pins [7:0] of bus 734 at I/O control circuitry 712 and are written into address register 714. The data may be received over input/output (I/O) pins [7:0] for a device capable of receiving eight parallel signals, or input/output (I/O) pins [15:0] for a device capable of receiving sixteen parallel signals, at I/O control circuitry 712 and are transferred to sample and hold circuitry 718. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 7 has been simplified to help focus on the embodiments of the disclosure.

A program function on selected cells, blocks, pages, or the like, of the memory 700 is performed as described above with respect to the methods, for precompensating threshold voltages, and arrays of FIGS. 1-6.

While FIG. 7 has been described with respect to sample and hold circuitry 718, it should be understood that the control logic 716 could be coupled to data latches instead of sample and hold circuitry 718 without departing from the scope of the disclosure. Data latches latch data, either incoming or outgoing. During a write operation, selected memory cells of the memory array 704 are programmed, for example using two sets of programming pulses as described above, until voltages indicative of their Vt levels match the data held in the data latches. This can be accomplished, as one example, using differential sensing devices to compare the held data to a threshold voltage of the selected memory cell.

Additionally, while the memory device of FIG. 7 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 734. Because the data signals represent bit patterns instead of individual bits, serial communication of an 8-bit data signal could be as efficient as parallel communication of eight signals representing individual bits.

CONCLUSION

Methods of programming a memory and memories using the methods have been described that, among other things, determine a pretarget threshold voltage for programming a selected cell of a memory depending upon an expected threshold voltage shift due to programming neighboring cells of the selected cell from an erased state to a pretarget threshold voltage.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a memory, comprising:
   determining a pretarget threshold voltage for a selected cell, wherein the pretarget threshold voltage is determined using a pretarget threshold voltage value for at least one neighbor cell of the selected cell;
   wherein the at least one neighbor cell of the selected cell is preprogrammed to the pretarget threshold voltage value for the at least one neighbor cell of the selected cell and is subsequently programmed to a target threshold voltage value for the at least one neighbor cell of the selected cell.

2. The method of claim 1, wherein determining further uses coupling ratios between the selected cell and the at least one neighbor cell of the selected cell.

3. The method of claim 1, wherein determining also uses pretarget threshold voltage values for at least one neighbor cell of the at least one neighbor cell of the selected cell.

4. The method of claim 1, wherein determining further comprises:
   setting the pretarget threshold voltage for the selected cell to an amount equal to a target threshold voltage for the selected cell minus an amount proportional to a total threshold voltage shift due to a plurality of neighbor cells of the selected cell.

5. The method of claim 4, wherein an amount proportional to a total threshold voltage shift is determined by:
   determining for each neighbor cell of the selected cell a threshold voltage shift due to each neighbor cell of the selected cell being programmed from an erased state to a pretarget threshold voltage;
   multiplying the determined threshold voltage shift for each neighbor cell of the selected cell by a coupling ratio between the selected cell and each neighbor cell of the selected cell; and
   summing each multiplied result to obtain the total threshold voltage shift.

6. The method of claim 5, wherein the pretarget threshold voltage of each neighbor cell of the selected cell is determined using pretarget threshold voltage values for each neighbor cell to each neighbor cell of the selected cell.

7. The method of claim 1, wherein the at least one neighbor cell of the selected cell comprises each neighbor cell of the selected cell.

8. The method of claim 2, wherein the at least one neighbor cell of the selected cell is an unprogrammed neighbor cell of the selected cell.

9. A memory device, comprising:
an array of memory cells; and
a controller configured to perform a method comprising:
determining a pretarget threshold voltage for a selected cell, wherein the pretarget threshold voltage is determined using a pretarget threshold voltage value for at least one neighbor cell of the selected cell;
wherein the at least one neighbor cell of the selected cell is preprogrammed to the pretarget threshold voltage value for the at least one neighbor cell of the selected cell and is subsequently programmed to a target threshold voltage value for the at least one neighbor cell of the selected cell.

10. The memory device of claim 9, wherein the controller uses coupling ratios between the selected cell and the at least one neighbor cell of the selected cell to determine the pretarget threshold voltage for the selected cell.

11. The memory device of claim 9, wherein the controller determines the pretarget threshold voltage value for the at least one neighbor cell of the selected cell by using pretarget threshold voltage values for at least one neighbor cell of the at least one neighbor cell of the selected cell.

12. The memory device of claim 9, wherein the controller determines the pretarget threshold voltage value for the selected cell by setting the pretarget threshold voltage for the selected cell to an amount equal to a target threshold voltage for the selected cell minus an amount proportional to a total threshold voltage shift due to a plurality of neighbor cells to the selected cell.

13. The memory device of claim 12, wherein the controller determines the total threshold voltage shift by determining for each neighbor cell of the selected cell a threshold voltage shift due to each neighbor cell of the selected cell being programmed from an erased state to a pretarget threshold voltage, multiplying the determined threshold voltage shift for each neighbor cell of the selected cell by a coupling ratio between the selected cell and each neighbor cell of the selected cell, and summing each multiplied result to obtain the total threshold voltage shift.

14. The memory device of claim 13, wherein the controller determines the pretarget threshold voltage for each neighbor cell of the selected cell using pretarget threshold voltage values for each neighbor cell of each neighbor cell of the selected cell.

15. The memory device of claim 9, wherein the at least one neighbor cell of the selected cell comprises each neighbor cell of the selected cell.

16. The memory device of claim 10, wherein the at least one neighbor cell of the selected cell is an unprogrammed neighbor cell of the selected cell.

17. A method of programming a memory, comprising:
determining a pretarget threshold voltage for a selected cell, wherein the pretarget threshold voltage is determined using a pretarget threshold voltage value for at least one neighbor cell of the selected cell, wherein the at least one neighbor cell of the selected cell is preprogrammed to the pretarget threshold voltage value for the at least one neighbor cell of the selected cell and is subsequently programmed to a target threshold voltage value for the at least one neighbor cell of the selected cell; and
determining an amount of floating gate coupling the selected cell will have due to subsequent programming of the at least one neighbor cell of the selected cell.

18. The method of claim 17, wherein determining the amount of floating gate coupling comprises:
calculating a threshold voltage movement for each of the at least one neighbor cells of the selected cell multiplied by its respective coupling ratio; and
summing the calculated threshold voltage movements multiplied by the respective coupling ratios.

19. The method of claim 1, further comprising:
determining the pretarget threshold voltage value for the at least one neighbor cell of the selected cell using a pretarget threshold voltage value for at least one neighbor cell of the at least one neighbor cell of the selected cell;
wherein the at least one neighbor cell of the at least one neighbor cell of the selected cell is preprogrammed to the pretarget threshold voltage value for the at least one neighbor cell of the at least one neighbor cell of the selected cell and is subsequently programmed to a target threshold voltage value for the at least one neighbor cell of the at least one neighbor cell of the selected cell.

* * * * *